US012494351B2

(12) United States Patent
Kato

(10) Patent No.: US 12,494,351 B2
(45) Date of Patent: Dec. 9, 2025

(54) PLASMA PROCESSING APPARATUS, METHOD FOR MANUFACTURING UPPER ELECTRODE ASSEMBLY, AND METHOD FOR REPRODUCING UPPER ELECTRODE ASSEMBLY

(71) Applicant: Tokyo Electron Limited, Tokyo (JP)

(72) Inventor: Makoto Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 651 days.

(21) Appl. No.: 17/863,422

(22) Filed: Jul. 13, 2022

(65) Prior Publication Data

US 2023/0023864 A1 Jan. 26, 2023

(30) Foreign Application Priority Data

Jul. 20, 2021 (JP) ................................ 2021-119726

(51) Int. Cl.
*H01J 37/32* (2006.01)
*H01J 9/14* (2006.01)

(52) U.S. Cl.
CPC .......... *H01J 37/32568* (2013.01); *H01J 9/14* (2013.01); *H01J 37/3255* (2013.01); *H01J 2237/334* (2013.01)

(58) Field of Classification Search
CPC .... H01J 37/32568; H01J 9/14; H01J 37/3255; H01J 2237/334; H01J 37/32522; H01J 2237/3321
See application file for complete search history.

(56) References Cited

U.S. PATENT DOCUMENTS 8,418,649 B2 * 4/2013 Larson .............. B29C 66/73111 156/345.46
2007/0170156 A1 * 7/2007 Hayashi ............ H01J 37/32559 219/121.45

(Continued)

FOREIGN PATENT DOCUMENTS

CN 1875514 A * 12/2006 .......... H01M 4/8605
CN 101005727 A * 7/2007 ........ H01J 37/32009

(Continued)

OTHER PUBLICATIONS

Calibration of TMA According to ASTM Standard Metho E-831; Waters TA Instruments; https://www.tainstruments.com/applications-notes/calibration-of-tma-according-to-astm-standard-method-e-831-ta419/ (Year: 2025).*

(Continued)

*Primary Examiner* — Jeffrie R Lund
(74) *Attorney, Agent, or Firm* — XSENSUS LLP

(57) ABSTRACT

There is provided a plasma processing apparatus comprising: a plasma processing chamber; a substrate support disposed in the plasma processing chamber; a lower electrode disposed in the substrate support; a conductive member disposed above the substrate support, the conductive member having at least one coolant inlet and at least one coolant outlet, the conductive member being connected to an RF potential or a DC potential; and an upper electrode assembly including: a conductive plate detachably connected to a bottom surface of the conductive member, the conductive plate having one or more coolant channels communicating with the at least one coolant inlet and the at least one coolant outlet; an electrode plate disposed below the conductive plate; and a conductive bonding sheet disposed between the electrode plate and the conductive plate.

14 Claims, 8 Drawing Sheets

(56) References Cited

U.S. PATENT DOCUMENTS

| | | | | |
|---|---|---|---|---|
| 2009/0095424 | A1 | 4/2009 | Bettencourt et al. | |
| 2009/0126633 | A1 * | 5/2009 | Hardin | H01J 37/32605 118/723 E |
| 2012/0069174 | A1 * | 3/2012 | Ye | G01N 25/72 348/92 |
| 2021/0032752 | A1 | 2/2021 | Noorbakhsh et al. | |
| 2022/0301830 | A1 * | 9/2022 | Li | H01J 37/32532 |
| 2023/0023864 | A1 * | 1/2023 | Kato | H01J 37/32568 |

FOREIGN PATENT DOCUMENTS

| | | | | |
|---|---|---|---|---|
| CN | 102110573 | A * | 6/2011 | H01J 37/32091 |
| JP | 2004-342704 | A | 12/2004 | |
| JP | 2007-194507 | A | 8/2007 | |
| JP | 2012-500471 | A | 1/2012 | |
| JP | 2015-216261 | A | 12/2015 | |
| JP | 2016-018768 | A | 2/2016 | |
| JP | 2016-018769 | A | 2/2016 | |
| JP | 2019-523995 | A | 8/2019 | |
| WO | WO-2009078923 | A2 * | 6/2009 | B32B 37/12 |
| WO | 2010/019197 | A2 | 2/2010 | |
| WO | 2017/218044 | A1 | 12/2017 | |

OTHER PUBLICATIONS

Coefficient of Thermal Expansion (CTE); BYU Electrical &Computer Engineering Integrated Microfabrication Lab; https://cleanroom.byu.edu/cte_materials (Year: 2025).*

* cited by examiner

PLASMA PROCESSING APPARATUS, METHOD FOR MANUFACTURING UPPER ELECTRODE ASSEMBLY, AND METHOD FOR REPRODUCING UPPER ELECTRODE ASSEMBLY

CROSS-REFERENCE TO RELATED APPLICATIONS

This application claims priority to Japanese Patent Application No. 2021-119726 filed on Jul. 20, 2021, the entire contents of which are incorporated herein by reference.

TECHNICAL FIELD

The present disclosure relates to a plasma processing apparatus, an upper electrode assembly used in a plasma processing apparatus, a method for manufacturing an upper electrode assembly, and a method for reproducing an upper electrode assembly.

BACKGROUND

Japanese Laid-open Patent Publication No. 2012-500471 discloses a configuration of a composite shower head electrode assembly in a plasma processing apparatus. In the configuration disclosed in Japanese Laid-open Patent Publication No. 2012-500471, an interfacial gel made of, e.g., silicone, is disposed between an electrode plate and a backing plate among a plurality of members constituting the composite shower head electrode assembly to control a temperature of the electrode plate while ensuring conductivity.

Further, Japanese Laid-open Patent Publication No. 2015-216261 discloses an upper electrode structure of a plasma processing apparatus. In the upper electrode structure disclosed in Japanese Laid-open Patent Publication No. 2015-216261, a temperature of a first plate in contact with a plasma processing space is controlled by forming a coolant channel in a second plate disposed above the first plate.

SUMMARY

The technique of the present disclosure effectively controls a temperature of an electrode plate constituting an upper electrode assembly by reducing a thermal resistance caused by bonding members in the case where a heat input to a processing chamber is increased.

In accordance with an aspect of the present disclosure, there is provided a plasma processing apparatus comprising: a plasma processing chamber; a substrate support disposed in the plasma processing chamber; a lower electrode disposed in the substrate support; a conductive member disposed above the substrate support, having at least one coolant inlet and at least one coolant outlet, and connected to an RF potential or a DC potential; and an upper electrode assembly, wherein the upper electrode assembly includes: a conductive plate detachably connected to a bottom surface of the conductive member and having one or multiple coolant channels communicating with the at least one coolant inlet and the at least one coolant outlet; an electrode plate disposed below the conductive plate; and a conductive bonding sheet disposed between the electrode plate and the conductive plate.

BRIEF DESCRIPTION OF THE DRAWINGS

The objects and features of the present disclosure will become apparent from the following description of embodiments, given in conjunction with the accompanying drawings, in which:

FIGS. 6 to 12A and 12B are explanatory diagrams showing examples of a specific shape of a coolant channel.

DETAILED DESCRIPTION

Figure 1:
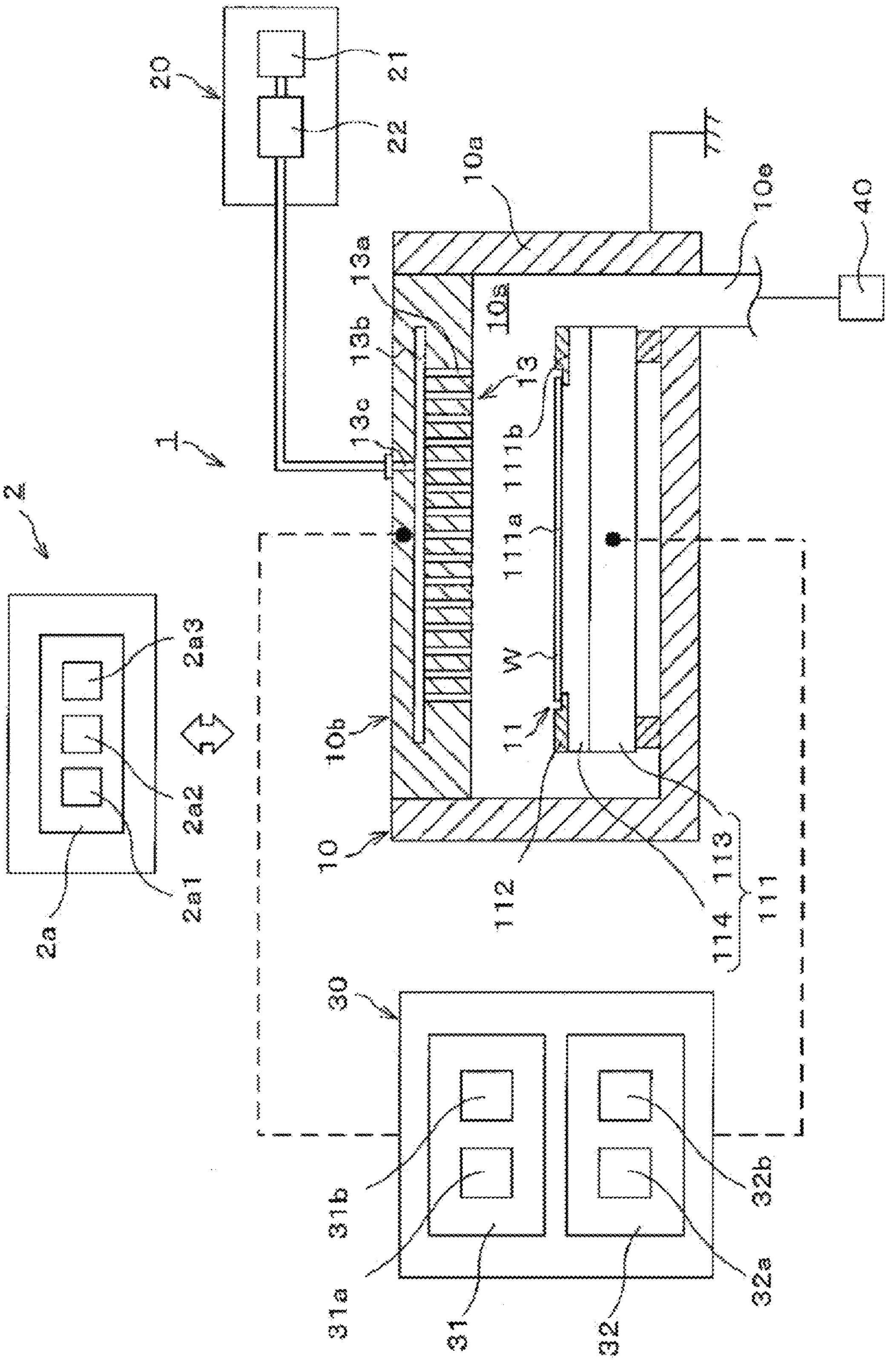
FIG. 1 is an explanatory diagram schematically showing a configuration of a plasma processing system.

In a semiconductor device manufacturing process, various plasma processing such as etching, film formation, diffusion, and the like are performed on a semiconductor substrate (hereinafter, simply referred to as "substrate") supported by a substrate support using plasma produced by exciting a processing gas supplied to a chamber. Such plasma processing is performed by a capacitively coupled plasma (CCP) processing apparatus including an upper electrode assembly constituting a part of a ceiling portion of the chamber.

Here, in a recent semiconductor device manufacturing process, along with a demand for miniaturization of a pattern formed on a substrate surface, a high output of a radio frequency (RF) power supply is required in a plasma processing apparatus. For example, deep etching is required. However, in the deep etching, a further increase in an RF output is required to shorten an etching time and improve ion straightness, so that a problem of the heat input to the chamber is generated.

If the heat input to the chamber becomes excessive, an adhesion state of etching by-products may change due to a temperature increase, or a chamber constituent member may be damaged by heat. Therefore, in order to control a plasma processing result for a substrate to be uniform or prevent damage to the chamber constituent member, it is required to improve the cooling performance of the chamber in response to the heat input from the plasma.

In Japanese Laid-open Patent Publication No. 2012-500471 described above, in the composite shower head electrode assembly (upper electrode assembly) constituting the chamber, the electrode plate positioned on a plasma exposed surface is attached via the interfacial gel to improve adhesion and thermal conductivity. Further, in Japanese Laid-open Patent Publication No. 2015-216261 described above, the first plate and the second plate in the upper electrode structure are attracted by an electrostatic attraction method to improve adhesion and thermal conductivity.

However, the interfacial gel described in Japanese Laid-open Patent Publication No. 2012-500471 is made of, e.g., silicone, and thus has low thermal conductivity and high thermal resistance. Therefore, when the heat input from the plasma becomes excessive, it is required to further improve the thermal conductivity. Further, when the interfacial gel is made of silicone, there are problems that silicone has a high-volume resistance and an electrical contact point with the electrode plate needs to be separately provided.

Although it is possible to improve the thermal conductivity by adding a filler to the silicone, it is not realistic because an interfacial thermal resistance increases due to deterioration of the adhesion. Further, even if the electrostatic attraction method described in Japanese Laid-open Patent Publication No. 2015-216261 is adopted, when the heat input to the chamber is excessive, the effect of reducing the thermal resistance is insufficient and needs to be further improved.

In view of the above, the technique of the present disclosure can effectively control the temperature of the electrode plate constituting the upper electrode assembly even when the heat input to the chamber becomes excessive. Hereinafter, a plasma processing system according to one embodiment and a plasma processing method including an etching method according to the present embodiment will be described with reference to the accompanying drawings. Like reference numerals will be given to like parts having substantially the same functions and configurations throughout this specification and the drawings, and redundant description thereof will be omitted.

<Plasma Processing System>

First, the plasma processing system according to the present embodiment will be described. FIG. 1 is a vertical cross-sectional view schematically showing a configuration of the plasma processing system according to the present embodiment.

The plasma processing system includes a capacitively coupled plasma processing apparatus 1 and a controller 2. The plasma processing apparatus 1 includes a plasma processing chamber 10, a gas supply unit 20, a power supply 30, and an exhaust system 40. Further, the plasma processing apparatus 1 includes a substrate support 11 and a gas introduction unit. The substrate support 11 is disposed in the plasma processing chamber 10. The gas introduction unit is configured to introduce at least one processing gas into the plasma processing chamber 10. The gas introduction unit includes an upper electrode assembly 13. The upper electrode assembly 13 is disposed above the substrate support 11. In one embodiment, the upper electrode assembly 13 is attached to a conductive member 10*b* (ceiling) forming a ceiling portion of the plasma processing chamber 10. A plasma processing space 10*s* defined by the upper electrode assembly 13, a sidewall 10*a* of the plasma processing chamber 10, and the substrate support 11 is formed in the plasma processing chamber 10. The plasma processing chamber 10 has at least one gas inlet for supplying at least one processing gas to the plasma processing space 10*s*, and at least one gas outlet for exhausting gases from the plasma processing space 10*s*. The sidewall 10*a* is grounded. The upper electrode assembly 13 and the substrate support 11 are electrically isolated from the plasma processing chamber 10.

The substrate support 11 includes a main body 111 and a ring assembly 112. The upper surface of the main body 111 has a central region 111*a* (substrate supporting surface) for supporting the substrate (wafer) W and an annular region 111*b* (ring supporting surface) for supporting the ring assembly 112. The annular region 111*b* surrounds the central region 111*a* in plan view. The ring assembly 112 includes one or more annular members, at least one of the annular members is an edge ring.

In one embodiment, the main body 111 includes a base 113 and an electrostatic chuck 114. The base 113 includes a conductive member. The conductive member of the base 113 functions as a lower electrode. The electrostatic chuck 114 is disposed on the upper surface of the base 113. The upper surface of the electrostatic chuck 114 has the central region 111*a* and the annular region 111*b*.

Although not shown, the substrate support 11 may include a temperature control module configured to adjust at least one of the ring assembly 112, the electrostatic chuck 114, and the substrate W to a target temperature. The temperature control module may include a heater, a heat transfer medium, a flow path, or a combination thereof. A heat transfer fluid such as brine or a gas flow through the flow path. The substrate support 11 may include a heat transfer gas supply unit configured to supply a heat transfer gas (backside gas) to a gap between the backside of the substrate W and the upper surface of the electrostatic chuck 114.

The gas supply unit 20 may include at least one gas source 21 and at least one flow rate controller 22. In one embodiment, the gas supply unit 20 is configured to supply at least one processing gas from the corresponding gas source 21 to the upper electrode assembly 13 through the corresponding flow rate controller 22. Each of the flow rate controllers 22 may include, e.g., a mass flow controller or a pressure-controlled flow rate controller. Further, the gas supply unit 20 may include one or more flow rate modulation devices for modulating the flow rate of at least one processing gas or causing the flow rate to pulsate.

The power supply 30 includes an RF power supply 31 coupled to the plasma processing chamber 10 through at least one impedance matching circuit. The RF power supply 31 is configured to supply at least one RF signal (RF power), such as a source RF signal and a bias RF signal, to the conductive member of the substrate support 11 and/or the conductive member (upper electrode) of the upper electrode assembly 13. Accordingly, plasma is produced from at least one processing gas supplied to the plasma processing space 10*s*. Therefore, the RF power supply 31 may function as at least a part of a plasma generator configured to generate plasma from one or more processing gases in the plasma processing chamber 10. Further, by supplying the bias RF signal to the lower electrode, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is coupled to the lower electrode and/or the upper electrode through at least one impedance matching circuit, and is configured to generate a source RF signal (source RF power) for plasma generation. In one embodiment, the source RF signal has a frequency within a range of 13 MHz to 160 MHz. In one embodiment, the first RF generator 31*a* may be configured to generate a plurality of source RF signals having different frequencies. The generated one or multiple source RF signals are supplied to the lower electrode and/or the upper electrode. The second RF generator 31*b* is coupled to the lower electrode through at least one impedance matching circuit and is configured to generate a bias RF signal (bias RF power). In one embodiment, the bias RF signal has a frequency lower than that of the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated one or more bias RF signals are supplied to the lower electrode. Further, in various embodiments, at least one of the source RF signal and the bias RF signal may pulsate.

The power supply 30 may include a DC power supply 32 coupled to the plasma processing chamber 10. The DC power supply 32 includes a first DC generator 32*a* and a second DC generator 32*b*. In one embodiment, the first DC generator 32*a* is connected to the lower electrode and is configured to generate a first DC signal. The generated first bias DC signal is applied to the lower electrode. In one embodiment, the first DC signal may be applied to another electrode, such as an attraction electrode in the electrostatic chuck 114. In one embodiment, the second DC generator 32*b* is connected to the upper electrode and is configured to generate a second DC signal. The generated second DC signal is applied to the upper electrode. In various embodiments, at least one of the first and second DC signals may pulsate. The first and second DC generators 32*a* and 32*b* may be provided in addition to the RF power supply 31, and the first DC generator 32*a* may be provided instead of the second RF generator 31*b*.

The exhaust system 40 may be connected to a gas outlet 10*e* disposed at a bottom portion of the plasma processing chamber 10, for example. The exhaust system 40 may include a pressure control valve and a vacuum pump. The pressure control valve adjusts a pressure in the plasma processing space 10*s*. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, a part or all of the controller 2 may be included in the plasma processing device 1. The controller 2 may include, e.g., a computer 2*a*. The computer 2*a* may include, e.g., a central processing unit (CPU) 2*a*1, a storage device 2*a*2, and a communication interface 2*a*3. The central processing unit 2*a*1 may be configured to perform various control operations based on a program stored in the storage device 2*a*2. The storage device 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN).

<Upper Electrode Assembly>

Figure 2:
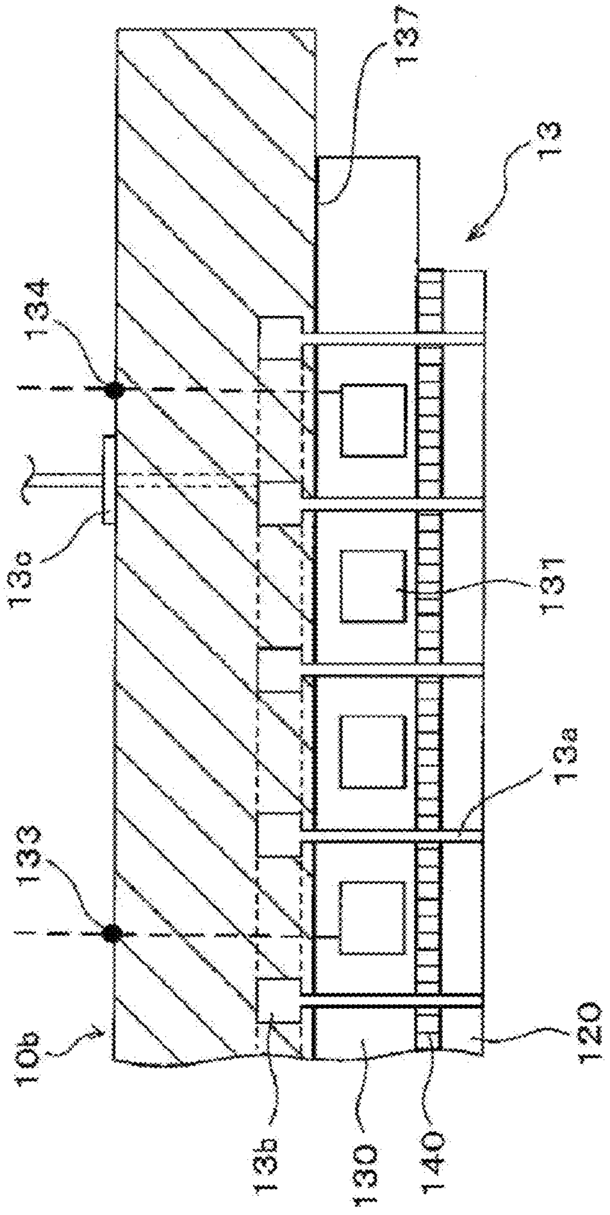
FIG. 2 is an enlarged explanatory diagram showing a part of an upper electrode assembly.

Next, the above-described upper electrode assembly 13 and the components of the plasma processing apparatus 1 that are related to the upper electrode assembly 13 will be described with reference to FIG. 2. FIG. 2 is an enlarged explanatory diagram showing a part of the upper electrode assembly 13.

As shown in FIG. 2, in one embodiment, the upper electrode assembly 13 is attached to the bottom surface of the conductive member 10*b* disposed above the substrate support 11, and includes an electrode plate 120 and a conductive plate 130. The conductive member 10*b* may form the ceiling portion of the plasma processing chamber 10, or may be attached to the ceiling portion of the plasma processing chamber 10. The electrode plate 120 and the conductive plate 130 are laminated in a vertical direction with a conductive bonding sheet 140 interposed therebetween. In other words, in the upper electrode assembly 13, the electrode plate 120, the conductive bonding sheet 140, and the conductive plate 130 are laminated in that order from the bottom. In other words, the electrode plate 120 is disposed below the conductive plate 130.

The conductive member 10*b* is made of a conductive material (second conductive material) such as Al (aluminum) or the like. The electrode plate 120 is made of, e.g., Si or SiC, and has a bottom surface exposed to the plasma processing space 10*s*. In other words, the electrode plate 120 has the plasma exposed surface exposed to the plasma produced in the plasma processing space 10*s*. The electrode plate 120 functions as the upper electrode in plasma processing. A plurality of gas inlet ports 13*a* are formed through the electrode plate 120 in a thickness direction (vertical direction). The gas inlet ports 13*a* are connected to the gas supply unit 20 through a gas diffusion space 13*b* formed in the conductive member 10*b* and a gas supply port 13*c*, and are configured to introduce at least one processing gas from the gas supply unit 20 into the plasma processing space 10*s*.

The conductive member 10*b* functions as a conductive support for detachably supporting the upper electrode assembly 13 including the electrode plate 120, the conductive bonding sheet 140, and the conductive plate 130 on a detachable surface 137. The upper electrode assembly 13 is fixed to the conductive member 10*b* by a fixing unit. The fixing unit may be of various types such as a lifting type disclosed in Japanese Laid-open Patent Publication No. 2016-018768 or Japanese Laid-open Patent Publication No. 2016-018769, a screw fixing type disclosed in U.S. Patent Publication No. US 2009/0095424 A1, an adhesive type disclosed in U.S. Patent Publication No. US 2021/0032752 A1.

At least one gas diffusion space 13*b* and at least one gas supply port 13*c* are formed in the conductive member 10*b*. The gas diffusion space 13*b* and the gas supply port 13*c* are connected to the gas supply unit 20, and are configured to introduce at least one processing gas from the gas supply unit 20 into the plasma processing space 10*s* through the gas inlet ports 13*a* formed in the electrode plate 120 as described above.

The conductive plate 130 has therein at least one coolant channel 131 configured to adjust the electrode plate 120 whose temperature varies due to the heat input from the plasma to a target temperature. The heat transfer fluid such as brine or a gas flows in the coolant channel. The heat transfer fluid circulates from a chiller (not shown) disposed outside the apparatus through a coolant inlet 133 and a coolant outlet 134 that are inserted into the conductive member 10*b* and disposed above the conductive member. In one embodiment, the conductive member 10*b* has an upper surface and a bottom surface. The conductive member 10*b* has at least one coolant inlet 133 and at least one coolant outlet 134 on the upper surface thereof. The conductive member 10*b* has at least one first coolant channel penetrating from at least one coolant inlet 133 to the bottom surface of the conductive member 10*b*. The conductive member 10*b* has at least one second coolant channel penetrating from the bottom surface of the conductive member 10*b* to at least one coolant outlet 134. The conductive plate 130 includes one or more coolant channels 131 communicating with at least one coolant inlet 133 through at least one first coolant channel and communicating with at least one coolant outlet 134 through at least one second coolant channel. A specific shape of the coolant channel 131 will be described later with reference to FIGS. 6 to 12. The conductive member 10*b* is connected to an RF potential or a DC potential. In one embodiment, the conductive member 10*b* is connected to the RF power supply 31 or the DC power supply 32.

In one embodiment, the conductive plate 130 is made of a high-toughness conductive material (third conductive material) capable of being resistant to a large pressing force. This is because stress such as screw torque or the like may be applied when the conductive plate 130 is fixed to the conductive member 10*b*. In one embodiment, the conductive plate 130 is made of a metal-based composite material referred to as molybdenum (Mo) or metal matrix composites (MMC).

Figure 3:
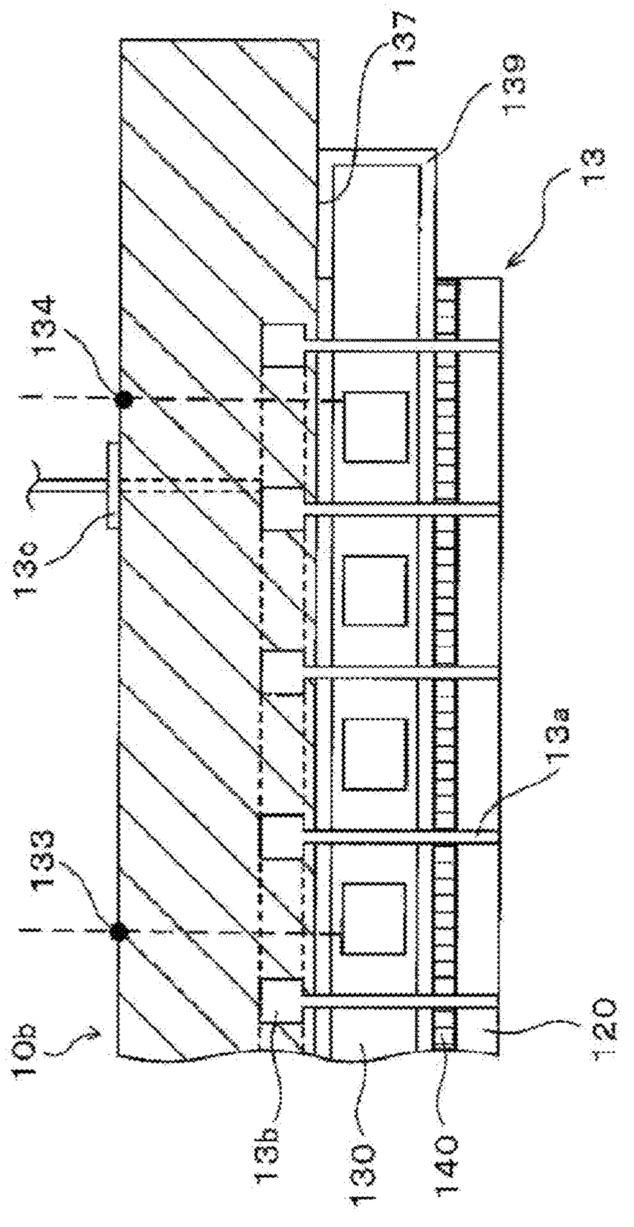
FIG. 3 is a schematic explanatory diagram showing a case where a conductive coat layer is formed on a conductive plate.

In one embodiment, the conductive plate 130 is made of a high resistance material such as Al—Si, AlN, and SiC. In that case, the conductive coat layer 139 is formed on the conductive plate 130. FIG. 3 is a schematic explanatory diagram showing a case where the conductive coat layer 139 is formed on the conductive plate 130. As shown in FIG. 3, the conductive coat layer 139 may be formed to electrically connect the conductive member 10*b* and the conductive bonding sheet 140. For example, the conductive coat layer 139 may be formed to cover the entire bottom surface, the entire side surfaces, and a part of the upper surface of the conductive plate 130. The conductive coat layer 139 is made of a conductive material such as aluminum or the like.

In one embodiment, the conductive bonding sheet 140 is made of a metal that is referred to as a so-called brazing metal having a melting point of 400° C. to 1000° C. In one embodiment, the conductive bonding sheet 140 is made of an Al—Si alloy, an Al—Mg alloy, or an Al—Si—Mg alloy. The bonding between the conductive plate 130 and the electrode plate 120 by the conductive bonding sheet 140 is performed by a pressing process using a gas pressure, such as hot pressing or hot isostatic pressing (HIP). Therefore, the electrode plate 120 is bonded to the conductive plate 130 via the conductive bonding sheet 140 without another fixing device.

The electrode plate 120 is, e.g., an Si or SiC electrode. In other words, the electrode plate 120 is made of Si or SiC. For example, in an etching process using plasma, the electrode plate 120 is used as the plasma exposed surface, and thus needs to be appropriately reproduced or replaced in response to peeling or deterioration over time as it is used, adhesion of etching by-products, or the like. Further, it is necessary to prepare a new electrode plate 120 at the start of plasma processing. Methods for manufacturing and reproducing the upper electrode assembly 13 including the electrode plate 120 will be described later with reference to FIGS. 4 and 5.

In one embodiment, the difference in linear expansion coefficient between the conductive plate 130 and the electrode plate 120 is 2 ppm/° C. or less in order to suppress generation of particles due to scratches or poor bonding between the conductive plate 130 and the electrode plate 120 in the case where the conductive plate 130 and the electrode plate 120 are bonded using the conductive bonding sheet 140 serving as a bonding layer. When the difference between coefficients of linear expansion exceeds 2 ppm/° C., thermal stress caused by the difference in linear expansion between the bonding temperature of the conductive bonding sheet 140 (melting temperature, 550° C. in the case of Al—Si based brazing material) and room temperature may act on and damage the bonding interface. Further, the thickness of the conductive bonding sheet 140 is smaller than that of the electrode plate 120.

<Substrate Processing Method Performed by Plasma Processing Apparatus>

Next, an example of a method for processing the substrate W in the plasma processing apparatus 1 configured as described above will be described. In the plasma processing apparatus 1, various plasma processing such as etching, film formation, diffusion and the like are performed on the substrate W.

First, the substrate W is loaded into the plasma processing chamber 10 and placed on the electrostatic chuck 114 of the substrate support 11. Next, a voltage is applied to the attraction electrode of the electrostatic chuck 114, so that the substrate W is attracted and held on the electrostatic chuck 114 by an electrostatic force.

When the substrate W is attracted and held on the electrostatic chuck 114, a pressure in the plasma processing chamber 10 is decreased to a predetermined vacuum level. Next, the processing gas is supplied from the gas supply unit 20 to the plasma processing space 10*s* via the upper electrode assembly 13. The source RF power for plasma generation is supplied from the first RF generator 31*a* to the lower electrode. Accordingly, the processing gas is excited, and plasma is produced. In this case, the bias RF power may be supplied from the second RF generator 31*b*. In the plasma processing space 10*s*, the substrate W is subjected to plasma processing by the action of the produced plasma.

Here, during the plasma processing performed on the substrate W, the temperature of the electrode plate 120 of the upper electrode assembly 13 disposed adjacent to the plasma processing space 10*s* varies due to the heat input from the plasma. When the temperature of the electrode plate 120 varies, the plasma processing result may be non-uniform in the plane of the substrate W.

Therefore, in the present embodiment, the temperature of the electrode plate 120 is controlled by the coolant channel 131 in the conductive plate 130. Specifically, for example, when the temperature of the electrode plate 120 increases due to the heat input from the plasma, the temperature of the conductive plate 130 is lowered by circulating a heat transfer fluid in the coolant channel 131. Accordingly, the heat transfer from the electrode plate 120 to the conductive plate 130 is promoted, thereby lowering the temperature of the electrode plate 120.

Here, in the upper electrode assembly 13 according to the present embodiment, the electrode plate 120, the conductive bonding sheet 140, and the conductive plate 130 are laminated in that order, and the electrode plate 120 and the conductive plate 130 are bonded by metal bonding that is referred to as a so-called brazing metal. Therefore, in the present embodiment, the heat transfer in the vertical direction, which is the lamination direction of the electrode plate 120 and the conductive plate 130, is promoted, and the temperature of the electrode plate 120 can be effectively controlled.

When the plasma processing is completed, the supply of the source RF power from the first RF generator 31*a* and the supply of the processing gas from the gas supply unit 20 are stopped. In the case of suppling the bias RF power during the plasma processing, the supply of the bias RF power is also stopped.

Next, the attraction and holding of the substrate W on the electrostatic chuck 114 is stopped, and the substrate W that has been subjected to the plasma processing and the electrostatic chuck 114 are neutralized. Then, the substrate W is separated from the electrostatic chuck 114, and taken out from the plasma processing apparatus 1. In this manner, a series of plasma processing is completed.

<Method for Manufacturing Upper Electrode Assembly and Method for Reproducing Upper Electrode Assembly>

Figure 4:
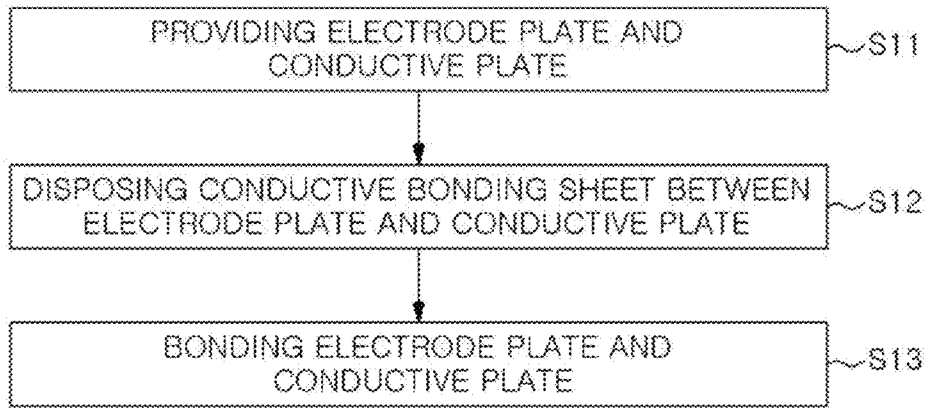
FIG. 4 is a flowchart showing a method for manufacturing an upper electrode assembly.
Figure 5:
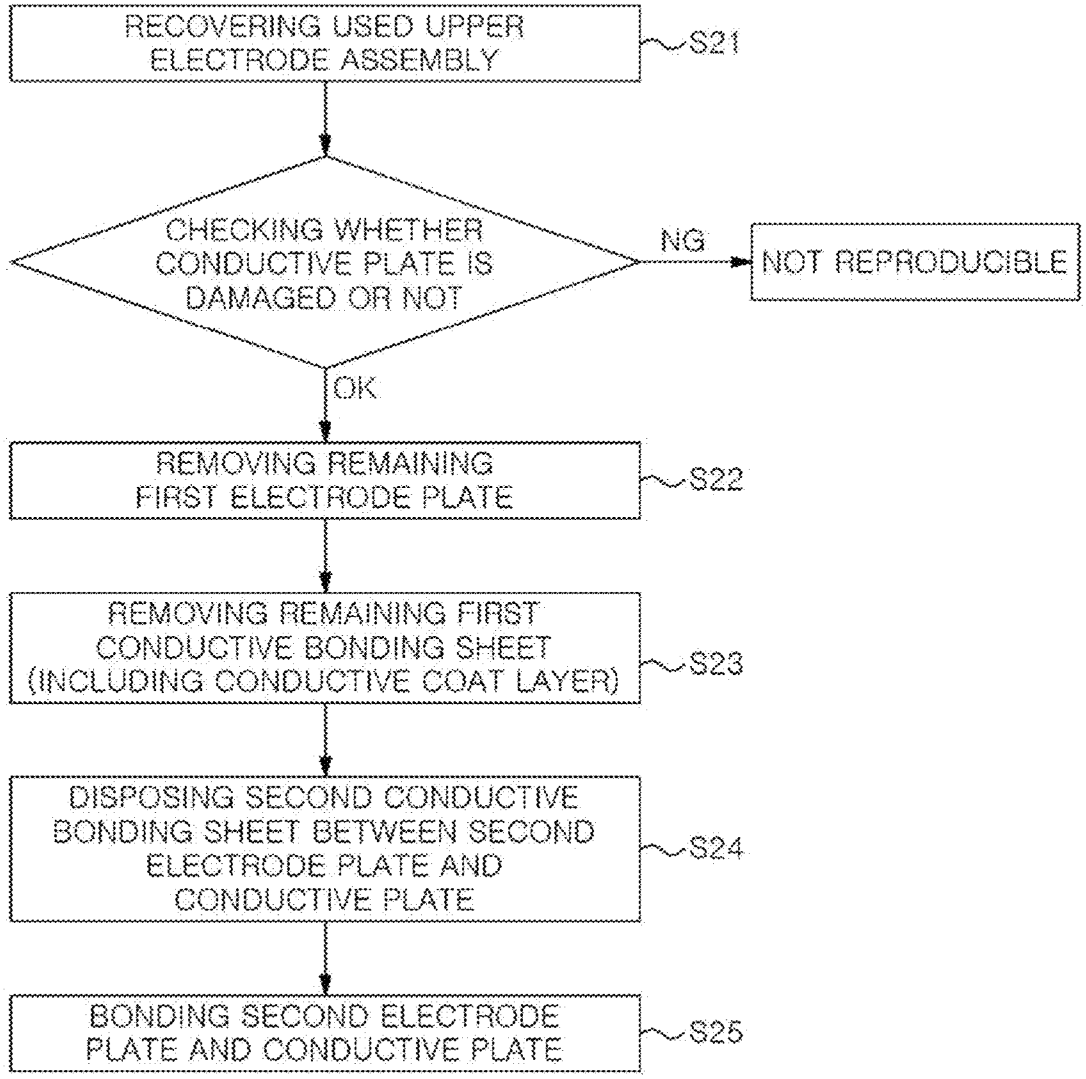
FIG. 5 is a flowchart showing a method for reproducing an upper electrode assembly.

FIG. 4 is a flowchart showing a method for manufacturing the upper electrode assembly 13, and FIG. 5 is a flowchart showing a method for reproducing the upper electrode assembly 13.

As shown in FIG. 4, the method for manufacturing the upper electrode assembly 13 according to the present embodiment is performed as follows. First, as shown in step S11, the electrode plate 120 and the conductive plate 130 are provided. Then, as shown in step S12, the conductive bonding sheet 140 is disposed between the electrode plate 120 and the conductive plate 130. In this state, as shown in step S13, the metal bonding between the electrode plate 120 and the conductive plate 130 is performed by melting the conductive bonding sheet 140 by hot pressing or hot isostatic pressing (HIP). In this manner, the upper electrode assembly 13 is manufactured.

As shown in FIG. 5, the method for reproducing the upper electrode assembly 13 according to the present embodiment is performed as follows. First, as shown in step S21, the used upper electrode assembly 13 is recovered. Then, in the recovered upper electrode assembly 13, whether the conductive plate 130 is damaged or not is checked, and subsequent steps are executed when the conductive plate 130 is not damaged. In other words, as shown in step S22, the used electrode plate 120 (here, the first electrode plate) remaining in the recovered upper electrode assembly 13 is removed. The electrode plate 120 may be removed by mechanical machining performed by grinding or peeling performed by heating of the conductive bonding sheet 140.

Then, as shown in step S23, the remaining used conductive bonding sheet 140 (here, the first conductive bonding sheet) is removed. The removal of the conductive bonding sheet 140 may be performed by blasting. Here, if the conductive coat layer 139 is formed on the conductive plate 130, the conductive coat layer 139 may also be removed when the conductive bonding sheet 140 is removed.

Next, as shown in step S24, a new electrode plate 120 (here, second electrode plate) and a new conductive bonding sheet 140 (here, second conductive bonding sheet) are prepared. Then, the second conductive bonding sheet 140 is disposed between the existing conductive plate 130 and the second electrode plate 120. Then, as shown in step S25, the metal bonding between the second electrode plate 120 and the existing conductive plate 130 is performed by melting the second conductive bonding sheet 140 by hot pressing or HIP. In this manner, the upper electrode assembly 13 including the new electrode plate 120 (second electrode plate) is manufactured using the existing conductive plate 130.

<Shape of Coolant Channel>

As described above, the conductive plate 130 constituting the upper electrode assembly 13 according to the present embodiment has therein at least one coolant channel 131 configured to adjust a temperature of the electrode plate 120 whose temperature varies due to a heat input from plasma to a target temperature. The shape and configuration of the coolant channel 131 can be arbitrarily designed depending on the temperature distribution required for the plasma exposed surface of the electrode plate 120. Examples thereof will be described below.

Figure 10:
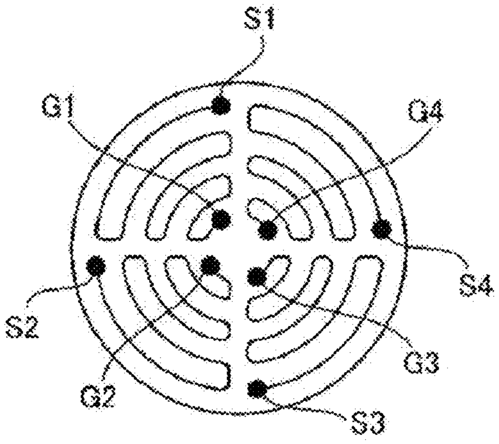
Figure 11:
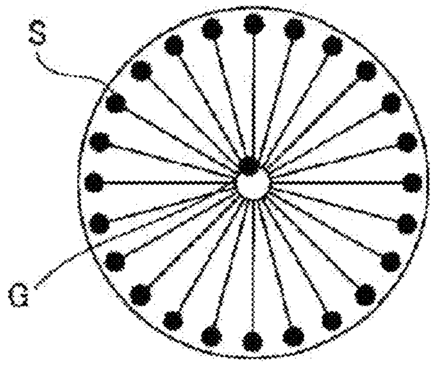
Figure 12A:
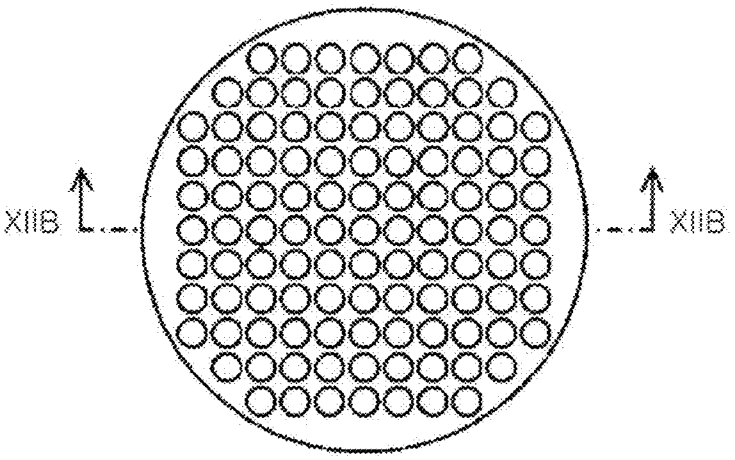
Figure 12B:
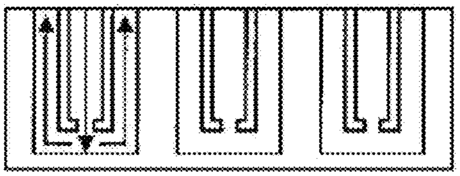

FIGS. 6 to 12A and 12B are explanatory diagrams showing examples of a specific shape of the coolant channel 131. FIGS. 6 to 12A shows the channel in plan view. FIG. 12B is a partially enlarged cross-sectional view of the channel taken along line XIIB-XIIB of FIG. 12A. FIGS. 6 to 12A and 12B show a start point S and an end point G of the coolant channel 131.

Figure 6:
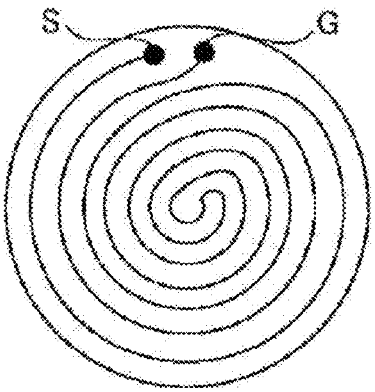
Figure 7:
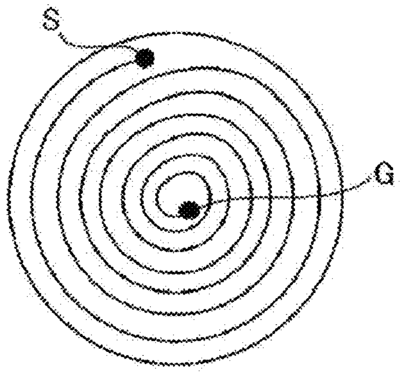
Figure 8:
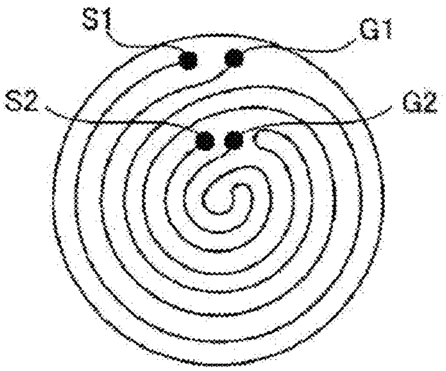
Figure 9:
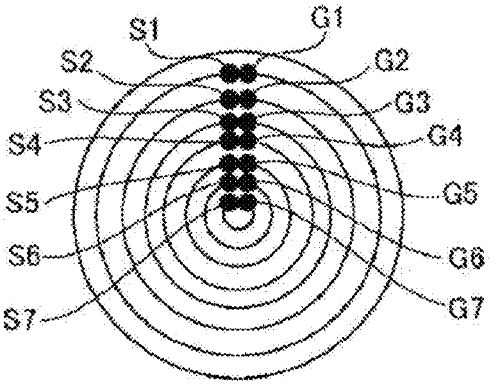

As shown in FIG. 6, for example, the coolant channel 131 may have a single stroke shape in which the start point and the end point are substantially the same. Further, as shown in FIG. 7, the coolant channel 131 may have a single stroke shape in which the start point and the end point are different. Further, as shown in FIGS. 8 and 9, a plurality of concentric channels having multiple start points and multiple end points may be provided. Further, as shown in FIG. 10, a plurality of channels having a predetermined geometric shape may be provided. Further, as shown in FIG. 11, radial channels may be provided.

Further, as shown in FIGS. 12A and 12B, a plurality of fine channels of an outflow type may be formed, and the temperature may be controlled by creating coolant flow (indicated by arrows in FIG. 12B) in each channel.

<Action and Effect of Technique of Present Disclosure>

In the above embodiments, in the upper electrode assembly 13, the electrode plate 120 and the conductive plate 130 are bonded by a metal bonding method, e.g., a bonding method using the conductive bonding sheet 140. Accordingly, the thermal resistance at the interface due to the bonding can be considerably reduced, and the temperature of the electrode plate 120 can be effectively controlled. Further, due to the metal bonding between the electrode plate 120 and the conductive plate 130, it is possible to obtain an electrical contact point therebetween.

Further, in the above embodiments, the upper electrode assembly 13 includes the electrode plate 120, the conductive bonding sheet 140, and the conductive plate 130, and the conductive member 10*b* detachably supports the upper electrode assembly 13 on the detachable surface 137. Accordingly, even if the electrode plate 120 needs to be reproduced or replaced due to peeling or deterioration over time or adhesion of etching by-products during plasma processing, it is possible to reuse the existing conductive plate 130, and also possible to easily reproduce and replace the electrode plate 120.

Further, the upper electrode assembly 13 according to the above embodiment has a configuration in which the coolant channel 131 is disposed in the conductive plate 130. Accordingly, the temperature of the electrode plate 120 can be effectively controlled compared to, e.g., the conventional configuration in which the coolant channel is disposed in the conductive member 10*b*, for example. In addition, the coolant channel 131 is disposed in the detachable conductive plate 130, so that the shape of the coolant channel 131 can be easily changed simply by attaching/detaching the member depending on the temperature distribution required for the plasma exposed surface of the electrode plate 120.

The embodiments of the present disclosure are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:

a plasma processing chamber;

a substrate support disposed in the plasma processing chamber;

a lower electrode disposed in the substrate support;

a conductive member disposed above the substrate support, the conductive member including:

at least one coolant inlet and at least one coolant outlet; a gas supply port; and a plurality of gas diffusion spaces fluidly connected to the gas supply port, the plurality of gas diffusion spaces being spaced apart from one another, the conductive member being connected to an RF potential or a DC potential; and an upper electrode assembly including:

a conductive plate detachably connected to a bottom surface of the conductive member, the conductive plate having one or more coolant channels, at least one coolant inlet and at least one coolant outlet, the one or more coolant channels communicating with the at least one coolant inlet and the at least one coolant outlet;

an electrode plate disposed below the conductive plate; and a conductive bonding sheet disposed between the electrode plate and the conductive plate, wherein the conductive plate further includes a conductive coat layer formed on at least a bottom surface and side surfaces of the conductive plate to electrically connect the conductive member and the conductive bonding sheet.

2. The plasma processing apparatus of claim 1, wherein the conductive bonding sheet is made of a first conductive material having a melting point of 400° C. to 1000° C.

3. The plasma processing apparatus of claim 2, wherein the first conductive material contains a metal.

4. The plasma processing apparatus of claim 2, wherein the first conductive material contains an Al—Si alloy, an Al—Mg alloy, or an Al—Si—Mg alloy.

5. The plasma processing apparatus of claim 1, wherein a difference in linear thermal expansion coefficient between the conductive plate and the electrode plate is 2 ppm/° C. or less.

6. The plasma processing apparatus of claim 1, wherein the conductive member is made of a second conductive material, and the conductive plate is made of a third conductive material different from the second conductive material.

7. The plasma processing apparatus of claim 6, wherein the third conductive material contains Mo or a metal matrix composite (MMC).

8. The plasma processing apparatus of claim 6, wherein the second conductive material contains Al.

9. The plasma processing apparatus of claim 1, wherein the electrode plate is made of Si or SiC.

10. The plasma processing apparatus of claim 1, wherein the one or more coolant channels in the conductive plate are configured as a single stroke channel having a start point and an end point that are substantially coincident, the single stroke channel extending across the conductive plate to provide uniform temperature control.

11. The plasma processing apparatus of claim 1, wherein the conductive plate is made of a material selected from the group consisting of Al—Si, AlN, and SiC.

12. The plasma processing apparatus of claim 1, wherein the conductive bonding sheet is bonded to the conductive plate and the electrode plate by hot isostatic pressing (HIP) at a bonding temperature of 400° C. to 1000° C., the conductive bonding sheet having a thickness less than that of the electrode plate.

13. The plasma processing apparatus of claim 1, wherein the one or more coolant channels include a plurality of concentric channels, each having a start point and an end point, configured to circulate a heat transfer fluid to adjust a temperature distribution across the electrode plate.

14. The plasma processing apparatus of claim 1, wherein the one or more coolant channels include a plurality of radial channels extending from a central region of the conductive plate to an outer peripheral region, configured to circulate a heat transfer fluid to minimize temperature gradients across the electrode plate.

* * * * *